United States Patent
Pnini (10) Patent No.: US 11,320,749 B2
(45) Date of Patent: May 3, 2022

(54) ACTUATOR DEVICE FOR ALIGNING AN ELEMENT, PROJECTION EXPOSURE APPARATUS FOR SEMICONDUCTOR LITHOGRAPHY, AND METHOD FOR ALIGNING AN ELEMENT

(71) Applicant: Carl Zeiss SMT GmbH, Oberkochen (DE)

(72) Inventor: Boaz Pnini, Goeggingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/220,305

(22) Filed: Apr. 1, 2021

(65) Prior Publication Data

US 2021/0223705 A1      Jul. 22, 2021

Related U.S. Application Data

(63) Continuation of application No. PCT/EP2019/071147, filed on Aug. 6, 2019.

(30) Foreign Application Priority Data

Oct. 2, 2018   (DE) .......................... 102018216964.0

(51) Int. Cl.
*G03F 7/20*        (2006.01)
(52) U.S. Cl.
CPC ...... *G03F 7/70758* (2013.01); *G03F 7/70141* (2013.01); *G03F 7/70258* (2013.01); *G03F 7/70825* (2013.01)
(58) Field of Classification Search
CPC ............. G03F 7/70758; G03F 7/70825; G03F 7/70258; G03F 7/70141
See application file for complete search history.

(56) References Cited

U.S. PATENT DOCUMENTS 6,276,066 B1      8/2001   Scheibl
2005/0275822 A1  12/2005   Butler
(Continued)

FOREIGN PATENT DOCUMENTS

DE           198 31 744 A1     1/2000
DE      10 2015 211 286 A1    12/2016
(Continued)

OTHER PUBLICATIONS

Translation of International Search Report for corresponding international application PCT/EP2019/071147, dated Nov. 27, 2019.

*Primary Examiner* — Hung Nguyen
(74) *Attorney, Agent, or Firm* — Fish & Richardson P.C.

(57) ABSTRACT

An actuator device for aligning an element includes at least one first actuator unit, which is secured to a support structure, for a first setting range and a second actuator unit, which is able to be secured to the element, for a second setting range. The second actuator unit is connected to an output element of the first actuator unit so that the positioning of the second actuator unit is adjustable by an adjustment of the output element. The first actuator unit has an adjusting element and a fixing element, which is able to be secured to the support structure. The fixing element secures the output element in a force-locking manner in an operating state of the element. The fixing element is furthermore configured to release the force-locking connection in a setting state of the element to enable an adjustment of the output element via the adjusting element.

24 Claims, 6 Drawing Sheets (56) References Cited

U.S. PATENT DOCUMENTS

2007/0076310 A1    4/2007   Sakino et al.
2007/0284502 A1   12/2007   Hsin et al.
2018/0101105 A1    4/2018   Freimann et al.
2021/0354243 A1*  11/2021   Shibazaki ............ B23K 26/144

FOREIGN PATENT DOCUMENTS

DE    10 2017 200 793 A1    1/2018
WO    WO 2005/026801 A2     3/2005

* cited by examiner

ACTUATOR DEVICE FOR ALIGNING AN ELEMENT, PROJECTION EXPOSURE APPARATUS FOR SEMICONDUCTOR LITHOGRAPHY, AND METHOD FOR ALIGNING AN ELEMENT

CROSS-REFERENCE TO RELATED APPLICATIONS

The present application is a continuation of, and claims benefit under 35 USC 120 to, international application PCT/EP2019/071147, filed Aug. 6, 2019, which claims benefit under 35 USC 119 of German Application No. 10 2018 216 964.0, filed Oct. 2, 2018. The entire disclosures of these applications are incorporated by reference herein.

FIELD

The disclosure relates to an actuator device for aligning an element. The disclosure also relates to a projection exposure apparatus for semiconductor lithography which includes an illumination system including a radiation source and also an optical unit. The disclosure furthermore relates to a method for aligning an element.

BACKGROUND

A multiplicity of components or elements which, in particular for the purpose of optimizing their function, have to be aligned as exactly as possible are known, in particular for electronics and optics. For the purpose of aligning such components, actuator devices are known which perform an alignment or setting of the components within a defined setting range, a so-called "actuator range".

Particular expected performance properties can be made of the actuator device if the setting range is intended to be comparatively large and the setting is nevertheless intended to be effected comparatively exactly. In general, a large setting range with at the same time very high positioning accuracy can be achieved only with difficulty or cost-intensively using known solutions.

In this case, particular expected performance properties can be made by projection exposure apparatuses for semiconductor lithography.

On account of the advancing miniaturization of semiconductor circuits, the expected performance properties made of resolution and accuracy of projection exposure apparatuses are equally increasing. Correspondingly high expected performance properties are also often made of the elements used there, for example the optical elements that inter alia influence the beam path within the projection exposure apparatuses.

In projection exposure apparatuses for semiconductor lithography, a multiplicity of actuators, for example moving coil actuators, are usually used in order to mechanically adjust or align the optical elements in the illumination system of the projection exposure apparatus, such that the beam path of a radiation source can be controlled or influenced and, for example, imaging aberrations can thereby be corrected and the projection exposure apparatus can thus be optimized.

WO 2005/026801 A2 discloses adjusting or aligning optical elements for EUV ("Extreme Ultraviolet") projection exposure apparatuses, such as mirrors, in a plurality of degrees of freedom using drivable movement axes via actuation units in the form of Lorentz actuators. Moving coil actuators can be used for this purpose, wherein a linearly moveable actuation unit, a translator, in the form of a magnet can be moved by electromagnetic interaction with a statically mounted coil surrounding the translator. In this case, the translator is connected via a guide element to the optical element, to which a movement carried out is transmitted.

The desired properties—becoming ever higher—made of the alignment or actuation of the optical elements in a projection exposure apparatus, for example the mirrors in EUV projection exposure apparatuses, generally presuppose comparatively large setting ranges with at the same time very high positioning accuracies. In this case, the large setting ranges can result, inter alia, also from assembly, adjustment and integration tolerances as well as thermal influences.

DE 198 31 744 A1 discloses an actuator device of the generic type in which provision is made for providing a spindle nut for converting a rotational movement into a linear movement for a coarse adjustment and, arranged in series therewith, a piezoelectric linear actuating element for fine adjustment.

Besides an adjustment by a plurality of millimeters, the device described in DE 198 31 744 A1 is intended furthermore to enable an exact positioning.

In this case is the optical elements, for example the mirrors of an EUV projection exposure apparatus, can weigh several 100 kg and a particularly stable construction can therefore be desirable, for example in order to maintain a high positioning accuracy in the operating state as well.

For this reason, some known projection exposure apparatuses do not make use of actuator devices in which two actuator units are coupled in series. Rather, actuators are used which are aligned in order to cover the entire setting range. For this purpose, actuators of this type generally have a setting range of approximately 1000 µm. In this type, it can be true that a very high positioning accuracy is achievable only with difficulty on account of the comparatively large setting range ("actuator range") for projection exposure apparatuses.

Known actuators used for projection exposure apparatuses can be linear actuators, for example piezoactuators.

SUMMARY

The present disclosure seeks to provide an actuator device for aligning an element which makes it possible to achieve a high positioning accuracy within a comparatively large setting range.

The present disclosure also seeks to provide a method for aligning an element which makes it possible to maintain a high positioning accuracy within a comparatively large setting range.

The present disclosure additionally seeks to provide a projection exposure apparatus for semiconductor lithography which includes at least one optical element to be aligned which can be set with high positioning accuracy within a comparatively large setting range.

In a general aspect, the disclosure provides an actuator device for aligning an element, which includes at least one first actuator unit, which is able to be secured to a support structure, for a first setting range and a second actuator unit, which is able to be secured to the element, for a second setting range. According to the disclosure, the second actuator unit is operatively connected to an output element of the first actuator unit in such a way that the positioning of the second actuator unit is adjustable by an adjustment of the output element. Optionally, the output element supports the second actuator unit, such that an adjustment of the output element results in an adjustment of the second actuator unit or a change in the alignment thereof.

The disclosure provides for the first actuator unit to have an adjusting element and a fixing element, which is able to be secured to the support structure, wherein the fixing element is configured to secure the output element in a force-locking manner in an operating state of the element. The fixing element is furthermore configured to release the force-locking connection in a setting state of the element, i.e. when the element is intended to be aligned within the first setting range, in order to enable an adjustment of the output element via the adjusting element.

The securing of the output element via force-locking or frictional engagement can be particularly suitable in order, in the operating state, to ensure a reliable transmission of the weight force of the element, in particular of the optical element, and to introduce the forces into the support structure.

By virtue of the fact that the actuator device includes two actuator units arranged in series, the tasks that the actuator device has to fulfil can be shared. The first actuator unit for a first setting range is optionally accorded the task of a coarse setting of the element. It has been found that a larger setting range is involved in particular for the first setting and/or the start-up and/or the basic setting of the element. In the case of the first setting, it is often desirable to compensate for assembly, adjustment and integration tolerances. This is effected in the case of projection exposure apparatuses, for example, by a procedure in which the wavefront is measured and, depending on the measurement result, a basic setting of the optical elements (mirrors, lens elements, prism, etc.) is performed in order to compensate for deviations. It has been found specifically in the case of projection exposure apparatuses that 90% of the total setting range of 1000 μm, for example, is involved only during the first setting in order to align the elements, in the present case the optical elements, for example mirrors of an EUV projection exposure apparatus, depending on the result of the wavefront measurement. According to the disclosure, this alignment, which can also be referred to as coarse setting, is optionally performed by the first actuator unit of the actuator device. The first actuator unit is therefore optionally designed to cover a correspondingly large setting range.

The second actuator unit for a second setting range optionally performs a fine setting, for example an alignment of the element during operation. Insofar as the element is an optical element, for example of a projection exposure apparatus, it has been found that during operation the setting range is comparatively small, compared with the setting range to perform a first setting of the optical elements. The setting range to align the element, for example the optical element, during operation is typically only 10% of the total setting range. In the case of projection exposure apparatuses, it can be sufficient if the second setting range is 100 μm. The second actuator unit is therefore optionally configured to cover a corresponding setting range, but not a setting range for the first setting.

The actuator device according to the disclosure now makes it possible, in a particularly advantageous way, to configure the first actuator unit in such a way that the first setting range optionally enables a coarse setting. For this purpose, the first actuator unit can be configured to cover a comparatively large setting range, wherein limitations in the case of the positioning accuracy are not primarily relevant in this regard. That is to say that it is acceptable for the positioning accuracy not to be as high as is ultimately desired for aligning the element, in particular the mirror. The actuator device according to the disclosure can fulfil this task via the second actuator unit, which then can have only a smaller setting range compared with the first actuator unit, for example in the ratio 9:1, which has the consequence that the second actuator unit can have a very high positioning accuracy.

The disadvantage of some known actuator devices including two actuator units arranged in series can be avoided by the actuator device according to the disclosure by virtue of the fact that the first actuator unit has an adjusting element and a fixing element, which is able to be secured to the support structure. In this case, the fixing element is configured to secure the output element in a force-locking manner in an operating state of the element. As a result, the fixing element can establish a fixed connection between the output element and the support structure. The weight of the element, for example of an optical element of a projection exposure apparatus, can thus be introduced into the support structure via the output element and the fixing element in the operating state, such that a fixed connection is created. The fixing element can connected be to the support structure fixedly and in an immobile fashion.

The fixing element is furthermore configured to release the force-locking connection in a setting state of the element in order to enable an adjustment of the output element via the adjusting element. This ensures that the element can be aligned to the desired extent by the first actuator unit within the first setting range, for example for the purpose of coarse setting, in particular before the first start-up. Once the alignment has been effected, the fixing element closes the force-locking connection, as a result of which the alignment of the element, in particular of the optical element, is fixed. In the operating state, the alignment for operation of the element, for example of the optical element, can then be effected by the second actuator unit. The actuator device according to the disclosure can thus make it possible to perform the coarse setting with the first actuator unit, which can also be referred to as a "long stroke" actuator, while during operation the second actuator unit, which can also be referred to as a "short stroke" actuator, performs the fine setting. In the case of optical elements of a projection exposure apparatus, such as mirrors of an EUV projection exposure apparatus, it has been found that a range of 100 μm during operation is sufficient to correct optical aberrations.

According to the disclosure, provision can be made for the first actuator unit, in particular the adjusting element of the first actuator unit, to be configured to carry out a stroke movement in order to raise or lower the output element in the axial direction. In this case, the axial direction is a direction running axially parallel to the center axis of the output element, such that the output element is displaced, i.e. raised or lowered, optionally orthogonally to a plane of the element, in particular of an optical element of a projection exposure apparatus.

Optionally, the first actuator unit or the adjusting element of the first actuator unit is configured to carry out only stroke movements in the axial direction and no movement in other directions.

According to the disclosure, provision can be made for the first actuator unit to have a housing, which is able to be secured to the support structure, wherein the fixing element and/or the adjusting element are/is secured in the housing.

The embodiment of the actuator unit with a housing, which is optionally secured or connected to the support structure rigidly or in an immobile fashion and in which the fixing element and/or the adjusting element are/is correspondingly secured in an immobile fashion, can have the effect that forces from the element, in particular an optical element, can be introduced via the output element and the fixing element into the housing of the first actuator unit and from there into the support structure.

As a result, the first actuator unit particularly can take up the weight of the element and introduces it into the support structure.

It can be advantageous if the fixing element is configured to secure the output element in a force-locking manner via clamping.

The configuration of the fixing element in such a way that the output element is secured in a force-locking manner by clamping has proved to be particularly suitable in order, on the one hand, to realize a reliable connection in the operating state and, on the other hand, to be able to release the connection between the fixing element and the output element in the setting state.

It can be advantageous if the fixing element is shrink-fitted onto at least one part of the output element in the operating state.

The realization of a force-locking connection by the fixing element being shrink-fitted onto at least one part of the output element, optionally in a manner extending around a partial region of the output element in a ring-shaped fashion, has proved to be particularly suitable. Shrink fitting is a technical method for force-locking connection which is based on the principle of thermal expansion. Permanent and fixed connections can be produced by shrink fitting. In this regard, it is known, for example, for the shaft and the wheel tires of railroad wheels to be connected to one another by shrink fitting.

It can be advantageous if the fixing element is embodied as a clamping ring.

It can be particularly advantageous if the clamping ring is shrink-fitted onto the output element.

Provision can be made for the clamping ring and the output element, which is optionally embodied as a shaft or piston, to be manufactured with an interference fit; optionally in such a way that the two parts are not connectable to one another at normal temperature. If the outer part, generally the clamping ring, is heated, the latter expands, such that the clamping ring and the output element are not connected to one another in a force-locking manner. As soon as a force-locking connection is desired, for example in the operating state, this can be achieved by the clamping ring cooling down, optionally to normal temperature or the ambient temperature, such that the clamping ring shrink-fits onto the outer periphery of the output element.

In principle, it is also possible to achieve a force-locking connection between the clamping ring and the output element by an opposite method, referred to as cold shrinking or joining by thermal expansion.

Alternatively, provision can also be made for cooling the output element in order that the force-locking connection between the fixing element and the output element is released. The force-locking connection can then be re-established by the output element subsequently being heated again, for example to normal temperature or the ambient temperature.

However, the realization of a shrink fit connection by heating (release) or cooling (connection) of the clamping ring can be particularly suitable.

According to the disclosure, provision can be made for the clamping ring to have a receiving opening, which circumferentially encompasses at least one part of the output element, and wherein the receiving opening in the operating state has a first diameter in order to fix the output element in a force-locking manner, and wherein the receiving opening in the setting state has a second, enlarged diameter in such a way that the force-locking connection to the output element is released in order to enable an adjustment of the output element via the adjusting element.

Such a configuration makes it possible particularly advantageously to establish a connection between the clamping ring and the output element, in particular if the latter is embodied as an output shaft or an output piston. Optionally, the output element has at least in a partial region an outer lateral surface which is embodied in a cylindrical fashion and is enclosed by the clamping ring. Optionally, the lateral surface is embodied as a right circular cylinder.

It can be advantageous if the clamping ring is heated in the setting state.

Furthermore, it can be advantageous if the clamping ring is not heated in the operating state, and optionally has a normal temperature. As a result, in the operating state, a force-locking connection between the clamping ring and the output element can be established without this involving an energy input. Such a solution is advantageous for many applications in the technological field since introducing energy and heat is often undesired or triggers negative effects. Particularly if the element is an optical element of a projection exposure apparatus, it can be advantageous if the force-locking connection involves no energy input or emits heat in the operating state.

It can be advantageous if the clamping ring has power terminals and/or is energizable for heating purposes.

Such a configuration can make it possible, in a simple manner, to heat the clamping ring, such that the latter expands and the connection to the output element is released.

Optionally, the clamping ring is embodied from high-grade steel.

Optionally, the output element is formed from a material which expands little when exposed to heat, and optionally has a low, for example very low, coefficient of thermal expansion. The embodiment of the output element from an ion-nickel alloy, such as Invar (a trademark owned by Imphy Alloys), can be particularly suitable. However, it is also possible to use some other material for the output element.

Heating the clamping ring via current can be effected by virtue of the clamping ring including a wire or being provided with a wire, which can have a high resistance, and the wire being energized, such that the latter correspondingly emits heat.

It can be advantageous if the clamping ring is not energized in the operating state.

This configuration prevents the clamping ring firstly from emitting heat and secondly from being able to generate a disturbing magnetic field. The emission of heat or magnetic influencing should, in general, be avoided particularly in the case of projection exposure apparatuses.

It can be advantageous if the clamping ring is connected to the housing via webs and/or connection elements and/or joints.

The clamping ring can particularly advantageously expand if the clamping ring is connected in the housing via webs or connection elements or joints which permit a defined thermal expansion of the clamping ring. The webs and/or the connection elements are optionally embodied integrally with the housing.

It can be advantageous if the webs and/or the connection elements and/or the joints are flexible and/or compliant and/or yield in the radial direction in order to enable a radial thermal expansion of the clamping ring, but are embodied in stiff and/or immobile fashion in the axial direction in order to take up forces acting in the axial direction of the output element and to introduce them into the support structure via the housing.

The aforementioned configurations can make it possible that the clamping ring can expand, in order to release the connection to the output element. At the same time, it can be ensured that the weight forces of the element, in particular of an optical element of a projection exposure apparatus, when the clamping connection is closed again, can reliably be taken up and introduced from the clamping ring via the webs and/or the connection elements and/or the joints into the housing and from there into the support structure.

The webs and/or the connection elements and/or the joints are optionally embodied as radially flexible and axially stiff. In this case, "axially stiff" should be understood to mean that the webs and/or the connection elements and/or the joints can take up forces in the axial direction, i.e. forces running axially parallel to the center axis of the output element or of the clamping ring, without yielding. "Radially flexible" should be understood to mean that the webs and/or the connection elements and/or the joints are embodied as flexible or can be compliant or yield in the radial direction, i.e. in a plane running orthogonally to the center axis of the output element or of the clamping ring.

In the case of a configuration of the clamping ring with webs or the like, an axially stiff and radially flexible configuration can optionally be achieved by virtue of the webs not running radially or not being aligned with the center axis of the clamping ring, but rather running at an angle thereto, such that the webs are deflected or yield if the clamping ring exerts a radial force on them.

The housing can be produced from any desired material that is suitable for taking up the forces, in particular also the weight forces of the element, and introducing them into the support structure. For example, an embodiment of the housing from metal, optionally also from high-grade steel or Invar, is possible.

It can be advantageous if the clamping ring in the setting state has a temperature of 40° C. to 100° C. (e.g., 50° C. to 90° C., 50° C. to 80° C., 50° C. to 70° C., 60° C.+/−5° C.). These values have proved to be particularly suitable for releasing the force-locking connection between the clamping ring and the output element in the setting state. If the heating is effected by energization, the energization can be correspondingly controlled by closed-loop or open-loop control.

It can be advantageous if the clamping ring in the operating state has a temperature of 10° C. to 30° C. (e.g., 15° C. to 25° C., 20° C. to 25° C., 22° C.+/−2° C., ambient temperature). The aforementioned values have proved to be particularly suitable in order that a reliable and permanent force-locking connection between the clamping ring and the output element is obtained in the operating state. The values can optionally also be chosen in such a way that they take into account the temperature at which the element to be aligned, in particular an optical element of a projection exposure apparatus, is operated.

According to the disclosure, provision can be made for the adjusting element to be heatable for the purpose of adjusting the output element. In principle, the adjusting element can be operated in various ways in order to achieve the effect that the adjusting element aligns the output element to the desired extent, after the release of the force-locking connection between the output element and the fixing element. It has proved to be particularly suitable, however, if the adjusting element is embodied as heatable for the purpose of adjusting the output element.

The adjusting element can be embodied in particular as a thermal actuator, for example as a so-called high output paraffin (HOP) actuator. Thermal actuators are actuators which include an expansion material element, for example a wax, an oil, a hard paraffin or else a metal, which, in a temperature-dependent manner, experiences a change in volume which is so significant that this can be converted into a movement, for example of a piston. Such thermal actuators usually use only a small amount of energy for the purpose of heating, which can optionally be provided by energization. Thermal actuators typically use only a small space.

It can be advantageous if the adjusting element is heated in such a way that it establishes a mechanical connection to the output element or exerts a force on the latter before the fixing element releases the force-locking fixing of the output element. This can avoid a situation in which, after the release of the force-locking connection between the fixing element and the output element, the element to be aligned changes its position or drops in an undesired manner.

In the setting state, the adjusting element can then influence the alignment of the output element in such a way that the element is aligned in a defined manner.

After the alignment of the output element by the adjusting element or when the element has been aligned to the desired extent and taking account of the positioning accuracy, the fixing element can close the force-locking connection again. Optionally, in this case, the fixing element in an embodiment as a clamping ring is cooled to the normal temperature or the ambient temperature again, in order to re-establish the force-locking connection. Afterward, optionally, the adjusting element can also be cooled again, such that a mechanical connection between the output element and the adjusting element can be disconnected again or the adjusting element no longer exerts a force on the output element.

It can be advantageous if the adjusting element in the operating state is mechanically separated from the output element and/or exerts no force on the output element.

It can be furthermore advantageous if the adjusting element in the setting state completely supports the weight force of the element assigned to the actuator device.

According to the disclosure, provision can be made for the first setting range of the first actuator unit to correspond to three to twenty times (e.g., four to fifteen times, five to fifteen times, six to twelve times, seven to eleven times, eight to ten times) the second setting range of the second actuator unit.

The aforementioned values have proved to be particularly suitable in order to achieve the effect that the first actuator unit covers a large setting range and the second actuator unit can have a high positioning accuracy on account of a significantly smaller setting range.

It is advantageous if the setting range of the first actuator unit is 700 to 1500 µm (e.g., 800 to 1200 µm, 800 to 1000 µm, 900 µm+/−50 µm), and/or if the setting range of the second actuator unit is 10 to 200 µm (e.g., 50 to 200 µm, 50 to 150 µm, 80 to 120 µm, 100 µm+/−10 µm).

The aforementioned values have proved to be suitable for many applications. The aforementioned values can be suitable, for example, if the element to be aligned is an optical element of a projection exposure apparatus, for example a mirror of an EUV projection exposure apparatus.

According to the disclosure, provision can furthermore be made for the setting accuracy of the second actuator unit to have an accuracy of better than 100 µm (e.g., better than 50

µm, better than 10 µm). The aforementioned values have proved to be particularly suitable in particular if the element to be aligned is an optical element of a projection exposure apparatus, in particular a mirror of an EUV projection exposure apparatus.

It can be advantageous if the element to be aligned is an optical element of a projection exposure apparatus.

Provision can be made, for example to align an optical element of a projection exposure apparatus, for combining a plurality of actuator devices, optionally three, to form an actuation device in order to align the optical element.

In a general aspect, the disclosure also provides a method for aligning an element via an actuator device including a first actuator unit, which is secured to a support structure and is designed for a first setting range, and a second actuator unit, which is secured to the element and is designed for a second setting range, following which the second actuator unit is operatively connected to an output element of the first actuator unit in such a way that the positioning of the second actuator unit is adjusted by an adjustment of the output element, wherein the first actuator unit has a fixing element and an adjusting element, wherein the method according to the disclosure provides that the fixing element is secured to the support structure and the fixing element secures the output element in a force-locking manner in an operating state of the element and following which the fixing element releases the force-locking connection in a setting state of the element, in which the element is aligned within the first setting range, following which the adjusting element adjusts the output element and following which the fixing element closes the force-locking connection again following the adjustment of the output element.

It can be advantageous if the first setting range of the first actuator unit is used for a coarse setting, optionally during the first setting and/or the basic setting and/or the start-up of the element, while the second setting range of the second actuator unit is used in the operating state of the element for the purpose of aligning the element.

It can be furthermore advantageous if during the alignment of the element via the first actuator unit the alignment of the element is measured and the setting is effected via the first actuator unit until a defined alignment of the element is attained.

It can be advantageous if the first actuator unit has a closed-loop control function or feedback function, such that the first actuator unit can align the output element in a targeted manner and correspondingly conclude the alignment. In principle, however, it is also possible to dispense with a closed-loop control or feedback function in the case of the first actuator unit and to measure the respectively achieved alignment of the element via a separate measuring system. Particularly if the element to be aligned is an optical element of a projection exposure apparatus, the measuring systems available can check the alignment of the optical element and control the first actuator unit accordingly.

It can be advantageous if the adjusting element is heated for the purpose of adjusting the output element.

Features and advantages which have already been described above or are described below in association with the device according to the disclosure are correspondingly applicable to the method according to the disclosure—and vice versa.

The device according to the disclosure and the method according to the disclosure can be particularly suitable for projection exposure apparatuses for semiconductor lithography including an illumination system including a radiation source and also an optical unit having at least one optical element to be aligned, wherein the optical element to be aligned is alignable and/or mountable and/or adjustable and/or manipulatable and/or deformable via an actuator device as described herein.

The disclosure is suitable, in principle, for a multiplicity of applications for correcting imaging aberrations of a projection exposure apparatus since, according to the disclosure, a large setting range can be corrected with at the same time high setting accuracy.

The disclosure can advantageously also be used for correcting figure errors in projection exposure apparatuses whose projection lenses have strong freeform surfaces, such as, for example, projection lenses for EUV lithography having a high numerical aperture (so-called "High-NA" EUV projection lenses).

The disclosure can also make it possible, for example with regard to EUV projection exposure apparatuses, advantageously to correct imaging aberrations caused by undesired heating of the optical elements, for example of the mirrors or the wafer.

The disclosure can be particularly suitable for use with microlithographic DUV ("Deep Ultra Violet") and EUV projection exposure apparatuses.

One possible use of the disclosure also relates to immersion lithography, wherein process errors involving a large actuator range are also correctable with high accuracy.

Additionally, reference is made to the fact that terms such as "including", "having" or "with" do not exclude other features or steps. Further, terms such as "a(n)" or "the" which indicate single steps or features do not preclude a plurality of features or steps—and vice versa.

BRIEF DESCRIPTION OF THE DRAWINGS

Exemplary embodiments of the disclosure are described in greater detail below with reference to the drawings.

The figures in each case show exemplary embodiments in which individual features of the present disclosure are illustrated in combination with one another. Features of an exemplary embodiments are also able to be implemented independently of the other features of the same exemplary embodiment, and may readily be combined accordingly by a person skilled in the art to form further expedient combinations and sub-combinations with features of other exemplary embodiments.

In the figures, functionally identical elements are provided with the same reference signs.

Schematically.

DESCRIPTION OF EXEMPLARY EMBODIMENTS

Figure 1:
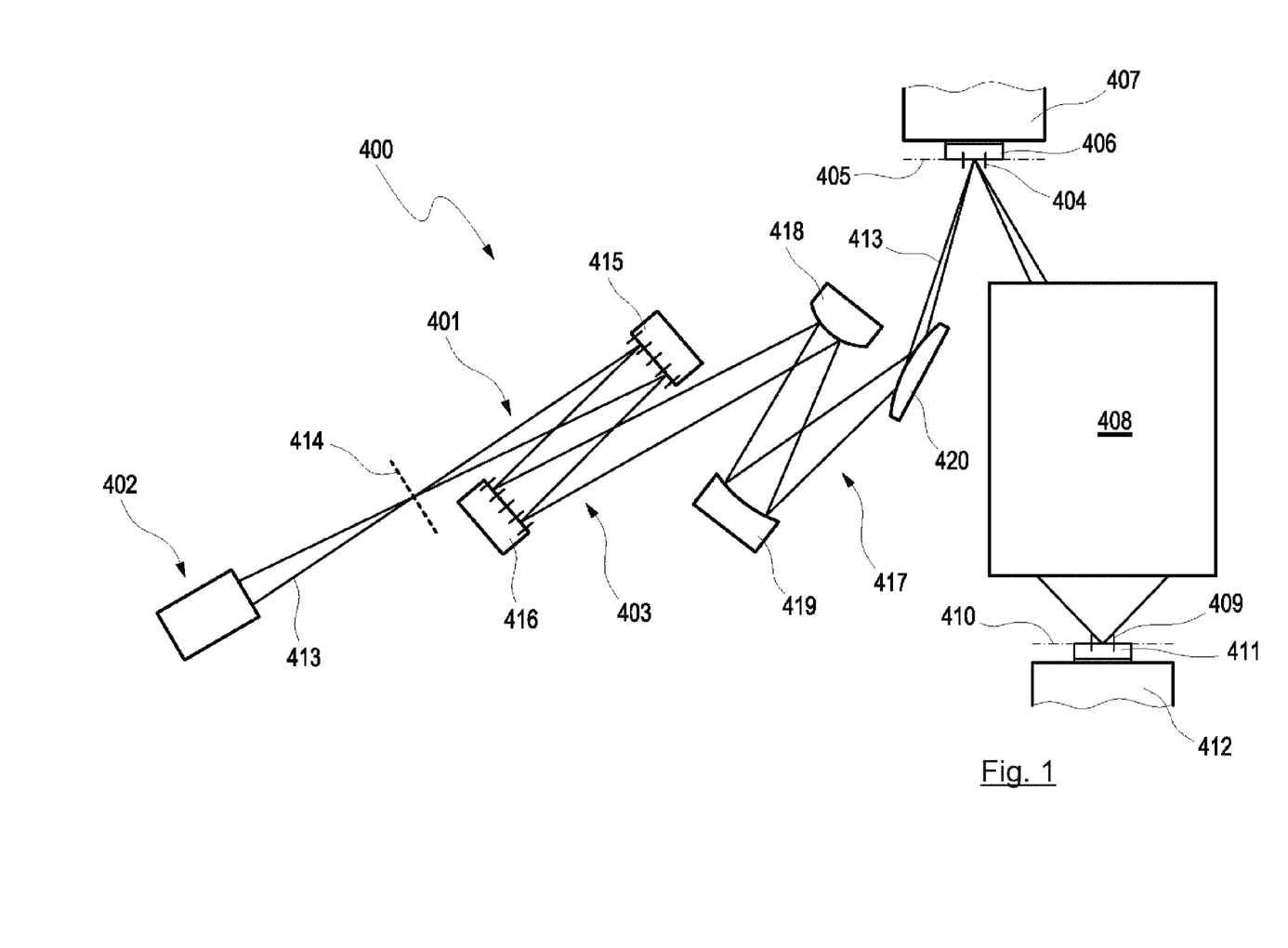
FIG. 1 shows an EUV projection exposure apparatus.

FIG. 1 shows by way of example the basic set-up of an EUV projection exposure apparatus 400 for semiconductor lithography for which the disclosure can find application. An illumination system 401 of the projection exposure apparatus 400 includes, besides a radiation source 402, an optical unit 403 for the illumination of an object field 404 in an object plane 405. A reticle 406 arranged in the object field 404 is illuminated, the reticle being held by a reticle holder 407, illustrated schematically. A projection optical unit 408, illustrated merely schematically, serves for imaging the object field 404 into an image field 409 in an image plane 410. A structure on the reticle 406 is imaged on a light-sensitive layer of a wafer 411 arranged in the region of the image field 409 in the image plane 410, the wafer being held by a wafer holder 412 that is likewise illustrated in part. The radiation source 402 can emit EUV radiation 413, in particular in the range of between 5 nanometers and 30 nanometers. Optically differently embodied and mechanically adjustable optical elements 415, 416, 418, 419, 420 are used for controlling the radiation path of the EUV radiation 413. In the case of the EUV projection exposure apparatus 400 illustrated in FIG. 1, the optical elements are embodied as adjustable mirrors in suitable embodiments, which are mentioned merely by way of example below.

The EUV radiation 413 generated via the radiation source 402 is aligned via a collector integrated in the radiation source 402 in such a way that the EUV radiation 413 passes through an intermediate focus in the region of an intermediate focal plane before the EUV radiation 413 impinges on a field facet mirror 415. Downstream of the field facet mirror 415, the EUV radiation 413 is reflected by a pupil facet mirror 416. With the aid of the pupil facet mirror 416 and an optical assembly 417 having mirrors 418, 419, 420, field facets of the field facet mirror 415 are imaged into the object field 404.

Figure 2:
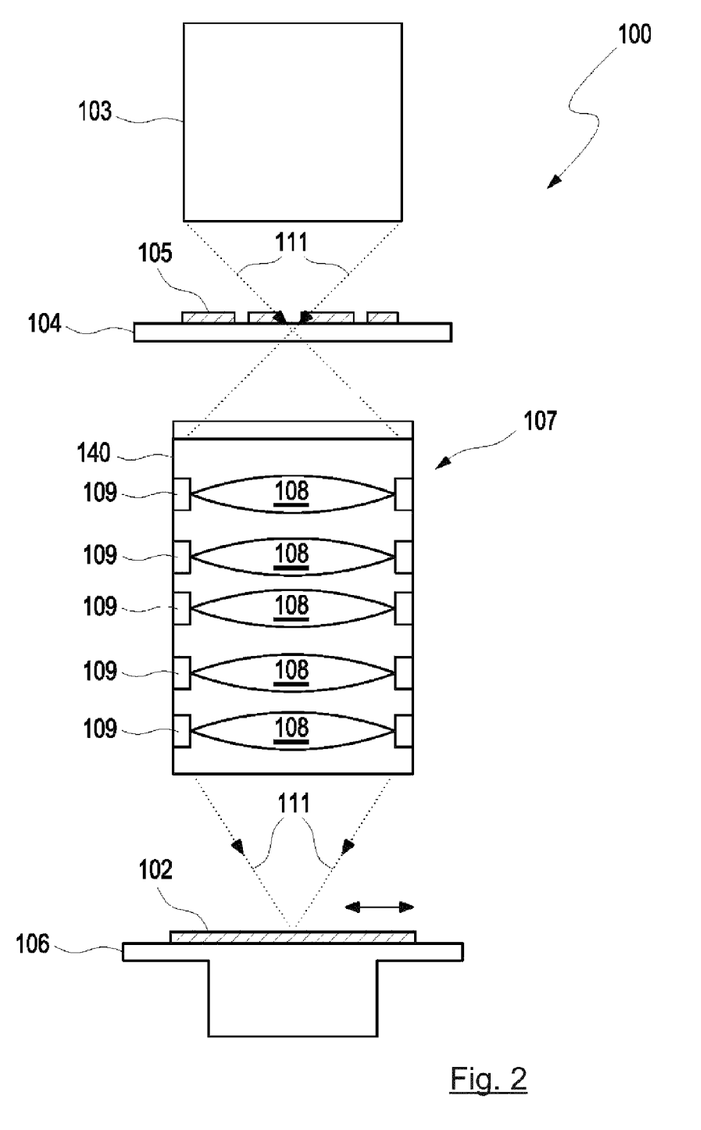
FIG. 2 shows a DUV projection exposure apparatus.

FIG. 2 illustrates an exemplary DUV projection exposure apparatus 100. The projection exposure apparatus 100 includes an illumination system 103, a device known as a reticle stage 104 for receiving and exactly positioning a reticle 105, by which the later structures on a wafer 102 are determined, a wafer holder 106 for holding, moving and exactly positioning the wafer 102 and an imaging device, to be specific a projection lens 107, with a plurality of optical elements 108, which are held by way of mounts 109 in a lens housing 140 of the projection lens 107.

The optical elements 108 may be embodied as individual refractive, diffractive and/or reflective optical elements 108, such as for example lens elements, mirrors, prisms, terminating plates and the like.

The basic functional principle of the projection exposure apparatus 100 provides for the structures introduced into the reticle 105 to be imaged onto the wafer 102.

The illumination system 103 provides a projection beam 111 in the form of electromagnetic radiation, which is involved for the imaging of the reticle 105 on the wafer 102. A laser, a plasma source or the like can be used as the source of this radiation. The radiation is shaped in the illumination system 103 via optical elements such that the projection beam 111 has the desired properties with regard to diameter, polarization, shape of the wavefront and the like when it is incident on the reticle 105.

An image of the reticle 105 is generated via the projection beam 111 and transferred from the projection lens 107 to the wafer 102 in an appropriately reduced form. In this case, the reticle 105 and the wafer 102 can be moved synchronously, so that regions of the reticle 105 are imaged onto corresponding regions of the wafer 102 virtually continuously during a so-called scanning process.

Figure 3:
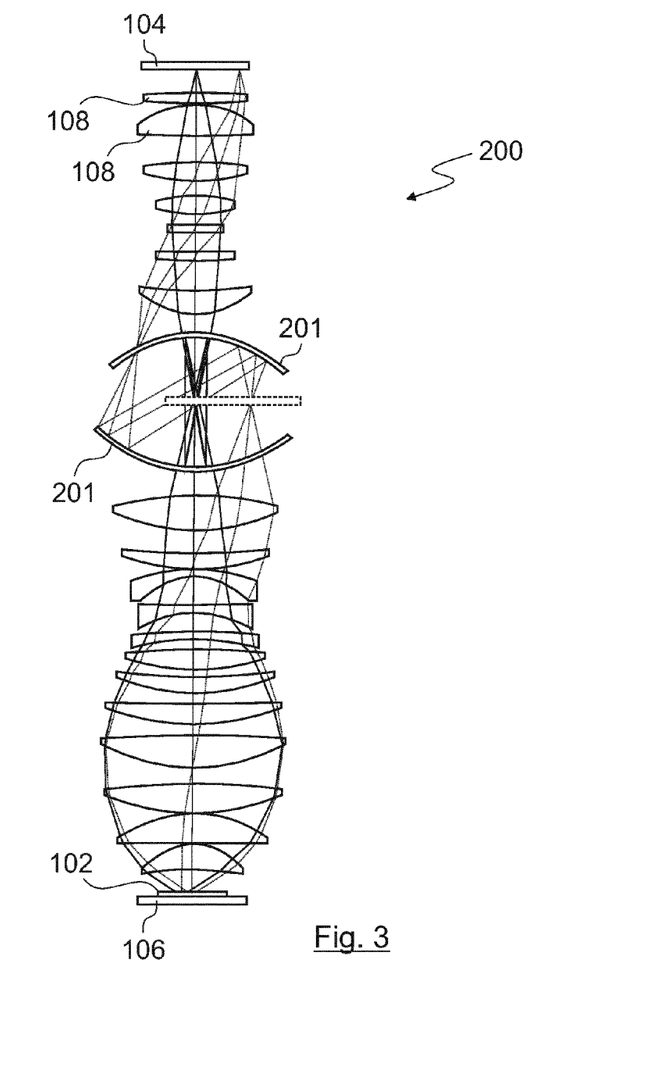
FIG. 3 shows a projection exposure apparatus for immersion lithography.

FIG. 3 illustrates by way of example a third projection exposure apparatus 200 in an embodiment as a DUV projection exposure apparatus for immersion lithography. For further background appertaining to such a projection exposure apparatus 200, reference is made to WO 2005/069055 A2, for example, the corresponding content of which is incorporated by reference in the present description; therefore, the exact functioning will not be discussed in detail at this juncture.

In a manner comparable with the DUV projection exposure apparatus 100 in accordance with FIG. 2, a reticle stage 104 is discernible, by which the later structures on the wafer 102 arranged on the wafer holder 106 or wafer stage are determined. For this purpose, the projection exposure apparatus 200 in FIG. 3 likewise has a plurality of optical elements, in particular lens elements 108 and mirrors 201.

The use of the disclosure is not restricted to use in projection exposure apparatuses 100, 200, 400, in particular also not with the described set-up.

The device according to the disclosure and the method according to the disclosure are suitable, in principle, for aligning arbitrary elements, in particular for applications in which the elements are intended to be aligned or set with a comparatively large setting range and a comparatively high positioning accuracy.

The disclosure and the following exemplary embodiment should also not be understood as being restricted to a specific design. The following figures illustrate the disclosure merely by way of example and highly schematically.

FIGS. 4 to 8 show possible exemplary embodiments and variants of an actuator device 1 according to the disclosure.

Figure 4:
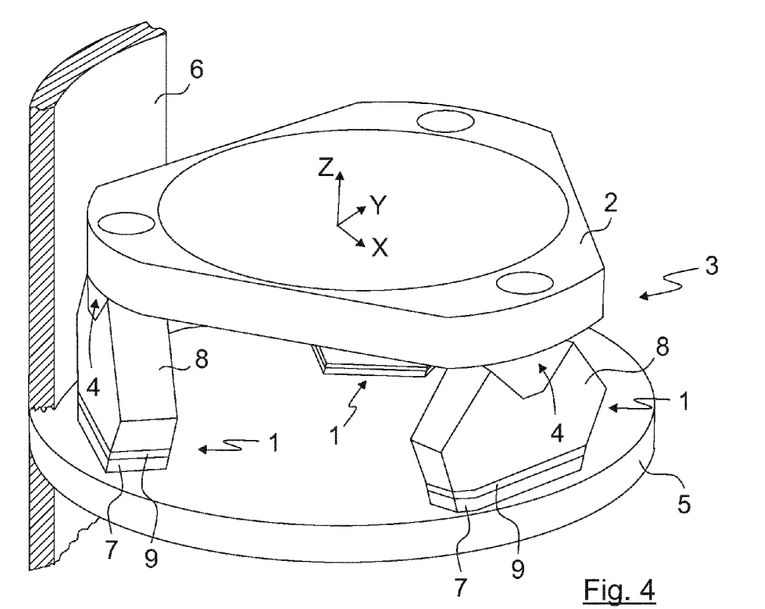
FIG. 4 shows a basic illustration of an element to be aligned, in an embodiment as an optical element of a projection exposure apparatus with an actuation device including three actuator devices according to the disclosure for aligning the optical element.

FIG. 4 shows a known set-up known for aligning an element 2 in an embodiment as an optical element. The set-up illustrated in FIG. 4 is also particularly suitable in order to use the actuator device 1 according to the disclosure or a plurality of actuator devices 1 according to the disclosure for aligning an optical element 2. For further configurations of the basic set-up for aligning an optical element 2, which configurations can also be realized in the context of the disclosure, reference is made to WO 2005/026801 A2.

Figure 6:
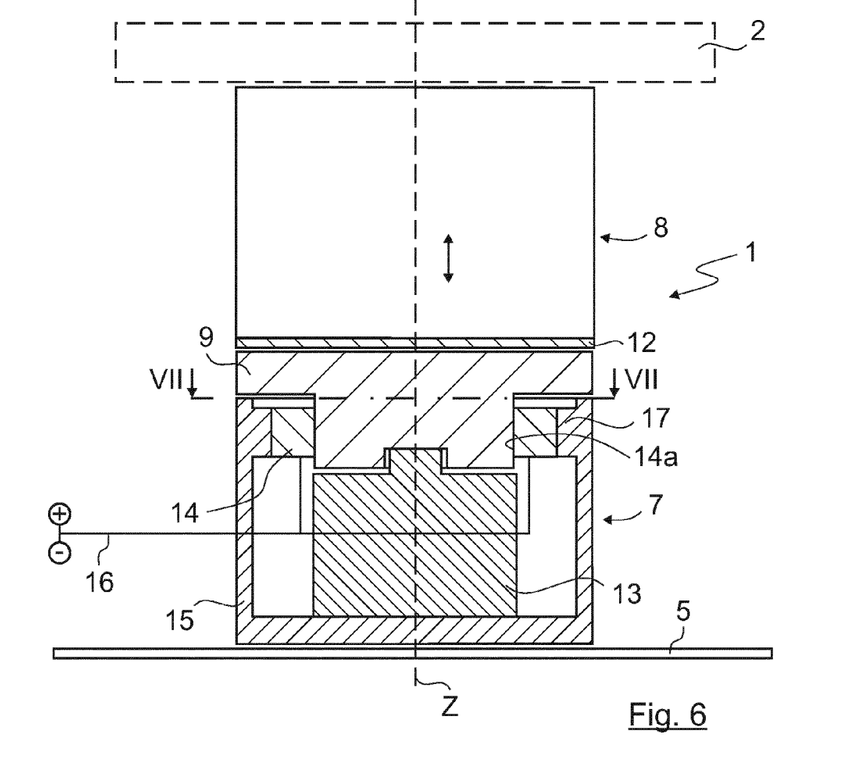
FIG. 6 shows a sectional view through a basic illustration of an actuator device including a first actuator unit and a second actuator unit.

The optical element 2 illustrated in FIGS. 4 and 6 can be, in particular, one of the optical elements 415, 416, 418, 419, 420, 108, 201 shown in FIGS. 1, 2 and 3, or a part of the optical elements 415, 416, 418, 419, 420, 108, 201.

As is evident from FIG. 4, the optical element is mounted or aligned by an actuation device 3 including a plurality of actuator devices 1, three in the exemplary embodiment, for aligning the optical element 2.

It has proved to be particularly suitable to mount an optical element 2 with the aid of three actuator devices 1. However, the disclosure is not restricted to a specific number of actuator devices 1. The actuator devices 1 are connected to the optical element 2 via a respective attachment point 4.

Via the attachment points 4, the optical element 2 can be aligned or set via the actuator device 1 in all axial directions of a coordinate system X, Y, Z, as shown in a basic illustration in FIG. 4.

FIG. 4 furthermore illustrates a support structure 5, which is connected to a housing part 6 shown only in a basic illustration.

Figure 5:
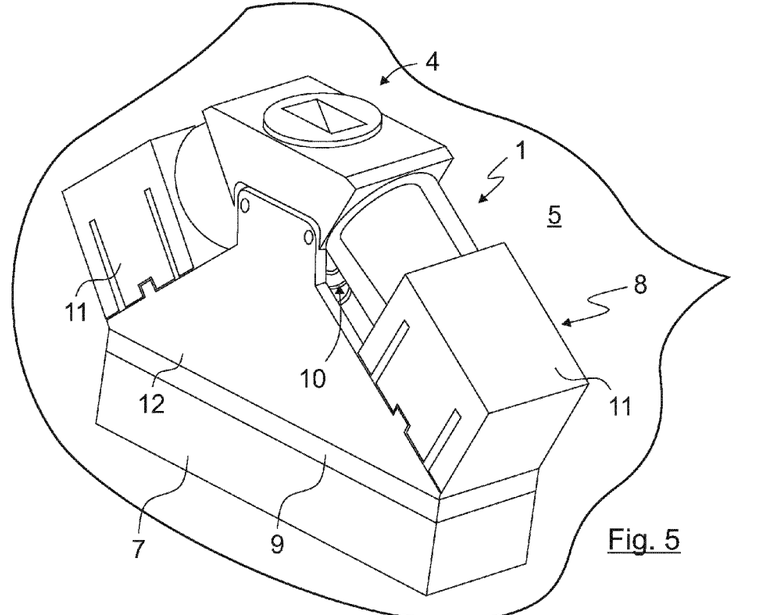
FIG. 5 shows a basic illustration of an actuator device according to FIG. 4.

FIG. 5 illustrates by way of example a single actuator device 1, which can also be used in the actuation device 3 illustrated in FIG. 4.

The actuator device 1 for aligning the optical element 2 as illustrated in FIG. 5 includes a first actuator unit 7 for a first setting range. In this case, the first actuator unit 7 is secured to the support structure 5. The basic principle of this is also evident from FIG. 4.

Furthermore, the actuator device 1 illustrated in FIG. 5 includes a second actuator unit 8, which is connected in series with the first actuator unit 7, for a second setting range. In this case, the second actuator unit 8 is secured to the element to be aligned, the optical element 2 in the exemplary embodiment, as is illustrated by way of example in FIG. 4. The optical element 2 is not shown in FIG. 5. In this case, the attachment point 4 can be used for connection to the optical element 2.

The disclosure provides for an output element 9 of the first actuator unit 7 to be operatively connected to the second actuator unit 8 in such a way that the positioning of the second actuator unit 8 is adjustable by an adjustment of the output element 9.

In the exemplary embodiment, the first actuator unit 7 or the output element 9 supports the second actuator unit 8, in respect of which reference is also made to the basic illustration in FIG. 6.

In the exemplary embodiment, provision is made for the first actuator unit 7 to be configured to perform a coarse setting of the optical element 2, while the second actuator unit 8 is configured for fine setting. Provision can be made for the first setting range to correspond to three to twenty times (e.g., four to fifteen times, five to fifteen times, six to twelve times, seven to eleven times, eight to ten times) the second setting range of the second actuator unit 8.

It is advantageous, in particular if the first setting range of the first actuator unit 7 is 700 to 1500 μm (e.g. 800 to 1200 μm, 800 to 1000 μm, 900 μm+/−50 μm), and/or if the setting range of the second actuator unit 8 is 10 to 200 μm (e.g., 50 to 200 μm, 50 to 150 μm, 80 to 120 μm, 100 μm+/−10 μm).

In the exemplary embodiment, provision is made for the setting accuracy of the second actuator unit 8 to have an accuracy of better than 100 μm (e.g., better than 50 μm, better than 10 μm).

In the exemplary embodiment, provision is made for the first setting range of the first actuator unit 7 to be used for a coarse setting, optionally during the first setting and/or the basic setting and/or the start-up of the element 2, while the second setting range of the second actuator unit 8 is used in the operating state for the purpose of aligning the element 2.

In the exemplary embodiment, it is provided that, during the alignment of the element 2 via the first actuator unit 7 the alignment of the element 2 is measured and the setting is effected via the first actuator unit 7 until a defined alignment of the element 2 is attained.

In the case of projection exposure apparatuses 100, 200, 400, the measurement during the alignment of the optical element 2 via the first actuator unit 7 can be effected by a measuring system which the projection exposure apparatus 100, 200, 400 has anyway in order to check the alignment of the optical element 2.

The second actuator unit 8 can have a construction that is known in principle, in respect of which reference is also made to WO 2005/026801 A2.

The second actuator unit 8 can also be just a simple linear motor or a Lorentz actuator or a moving coil actuator.

In the exemplary embodiment, provision is made for the second actuator unit 8 to have a construction which has proved to be particularly worthwhile in principle, in particular for the alignment of optical elements 415, 416, 418, 419, 420, 108, 201 of projection exposure apparatuses 100, 200, 400. However, the disclosure is not restricted thereto. The actuator device 1 according to the disclosure also has the advantages afforded if the first actuator unit 7 is connected to an arbitrary second actuator unit 8.

One particular advantage of the actuator device 1 according to the disclosure is that this actuator device has a modular construction. In principle the first actuator unit 7 can be combined with an arbitrary second actuator unit 8, without the need to make changes to the second actuator unit 8 in terms of the design or basic principles. This has the advantage that the functional principle of the second actuator unit 8, which is secured to the element to be aligned, the optical element 2 in the exemplary embodiment, can remain unchanged, such that changes for a complex system, such as a projection exposure apparatus, for example, in order to realize the solution according to the disclosure are comparatively small. The proven construction of the second actuator unit 8 can be maintained, in principle, wherein advantageously the second setting range of the second actuator unit 8 can be correspondingly reduced and the accuracy can thus be increased. Further changes to the second actuator unit 8, in particular changes in terms of basic principles, are not necessary.

Since the construction of the second actuator unit 8 can remain unchanged in terms of basic principles and actuator units of this type are sufficiently known, only one possible, but advantageous construction will be explained in terms of basic principles below with reference to FIG. 5.

The second actuator unit 8 illustrated in FIG. 5 includes (optionally) a weight compensation device 10 and two actuation elements 11 for aligning the optical element 2. Such a construction is particularly suitable for aligning an optical element 2, although the disclosure is not restricted thereto. In particular, provision can also be made for the second actuator unit 8 to be embodied from or to consist of only a weight compensation device 10 or for the second actuator unit 8 to be embodied by one or more, in particular two or three, actuation elements 11.

The actuation elements 11 can be known actuators, in particular actuators that can be controlled by magnetic forces. The actuation elements 11 can be embodied for example as Lorentz actuators or moving coil actuators. The same applies to the weight compensation device 10 as well. Both the weight compensation device 10 and the actuation elements 11 can also be actuated mechanically, however; in particular, a spring for taking up the weight force can also be provided for example for the weight compensation device 10.

It is known to use actuation elements 11 or actuators and weight compensation devices 10 in diverse manifestations which can be used in the context of the disclosure for realizing the second actuator unit 8.

As revealed by FIG. 5, the second actuator unit 8 is embodied in such a way that it enables a two-dimensional movement, which is transmittable to the optical element 2 via the attachment point 4. For this purpose, a corresponding articulated connection is provided, which is embodied as part of the attachment point 4 in the exemplary embodiment.

The second actuator unit 8 has a base point 12, upon the adjustment of which the weight compensation device 10 and the actuation elements 11 are corresponding adjusted as well.

It should be mentioned again that the illustration in accordance with FIGS. 4 and 5 is given merely by way of example in order to illustrate one possible realization of the disclosure on the basis of a particularly suitable embodiment, but the disclosure is not restricted thereto.

The solution according to the disclosure is suitable, in particular, for aligning an optical element 2 embodied as a mirror. In this case, the present disclosure is particularly suitable for a projection exposure apparatus 100, 200 or 400, but the disclosure is not restricted to this either.

In the exemplary embodiment, provision is made for the base point 12 of the second actuator unit 8 to be connected to the output element 9 of the first actuator unit 7. An alignment of the output element 9 thus has the effect that the entire second actuator unit 8 is correspondingly adjusted.

In the exemplary embodiment, provision is made for the output element 9 to carry out a stroke movement and for the second actuator unit 8 thus to be raised or lowered, i.e. moved orthogonally to the plane of the optical element 2 in a direction toward the latter or away from the latter.

In the exemplary embodiment, provision is made for the first actuator unit 7 to be configured to carry out only a stroke movement and no movement in a different direction, such that the first actuator unit 7 only causes the second actuator unit 8 to be raised or lowered.

It goes without saying that other configurations are also possible here.

Figure 7:
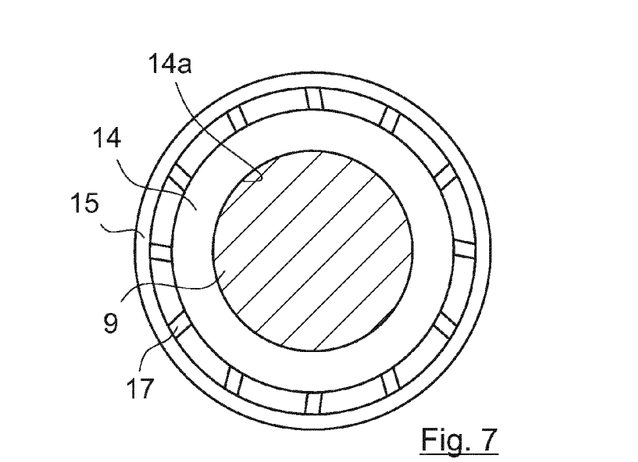
FIG. 7 shows a sectional illustration of the first actuator unit along the line VII-VII in FIG. 6.

FIGS. 6 and 7 show a particularly advantageous construction of the first actuator unit 7 in order to adjust the output element 9 and thus the second actuator unit 8 and to fix the position set.

FIG. 6 also shows the optical element 2 using dashed lines and in a basic illustration.

As is evident from FIGS. 6 and 7, the first actuator unit 7 has an adjusting element 13 and a fixing element 14, which is able to be secured to the support structure 5. The fixing element 14 is secured to the support structure 5 by virtue of the fact that the fixing element 14 is secured in a housing 15 of the first actuator unit 7 and the housing 15 itself is in turn secured to the support structure 5. The adjusting element 13 is also secured in the housing 15 and thus correspondingly secured to the support structure 5.

As will be described in even greater detail below, the fixing element 14 is configured to secure the output element 9 in a force-locking manner in an operating state of the optical element 2. In this case, in the case of a projection exposure apparatus, the operating state is a state in which the projection exposure apparatus is operated in order to produce semiconductor components. In the exemplary embodiment, the force-locking connection (force-locking engagement or frictional engagement) is effected by the fixing element 14 securing the output element 9 by clamping. For this purpose, the fixing element 14 is shrink-fitted onto the output element 9 in the operating state. As explained in even greater detail below, the fixing element is embodied as a clamping ring 14 in the exemplary embodiment.

The disclosure provides for the fixing element or the clamping ring 14 provided in the exemplary embodiment to release the force-locking connection in a setting state of the optical element 2 in order to enable an adjustment of the output element 9 via the adjusting element 13.

In the case of a projection exposure apparatus, the setting generally takes place only once before start-up. For this purpose, a wavefront measurement is effected, in which the tolerances are ascertained. In order to compensate for the tolerances of the system, a coarse setting is subsequently performed via the first actuator unit 7. It goes without saying that it is possible, even during the later operating state, at regular or irregular intervals, to provide for the apparatus to be restored to the setting state, for example in order to compensate for ageing-dictated effects via a renewed coarse setting. This is not usually necessary, however.

In the exemplary embodiment, provision is made for the output element 9 to be embodied as a shaft, a cylinder or optionally as a piston. In this respect, reference is made to the basic illustrations in FIGS. 6 to 8.

In the exemplary embodiment, provision is furthermore made for the clamping ring 14 to have a receiving opening 14a, which circumferentially encompasses at least one part of the output element 9, optionally embodied in the form of a piston. In this case, in the operating state, the receiving opening 14a has a first diameter in order to fix the output element 9 in a force-locking manner. In the setting state, by contrast, the receiving opening 14a has a second, enlarged diameter such that the force-locking connection to the output element 9 is released.

Figure 8:
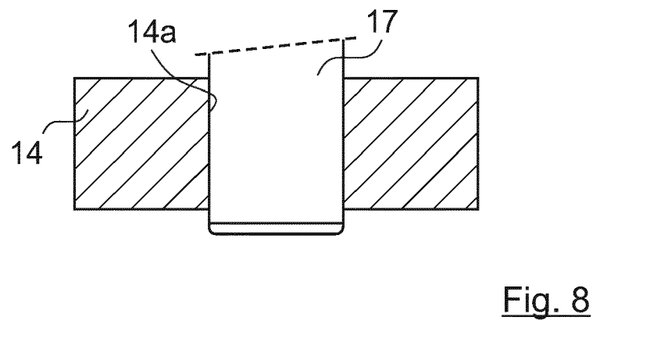
FIG. 8 shows a basic illustration of a fixing element in an embodiment as a clamping ring shrink-fitted onto an output element embodied as a piston.

FIG. 8 shows a basic force-locking connection—produced by clamping—between the clamping ring 14 and the output element 9, optionally embodied in the form of a piston. In this case, an interference fit is provided in such a way that the clamping ring 14 and the output element 9 are connected to one another by clamping or shrink fitting at normal temperature or at ambient temperature. In order to release the force-locking connection effected as a result, provision is then made for the clamping ring 14 to be heated. In the exemplary embodiment, the setting state can thus be attained by the clamping ring 14 being heated. In the exemplary embodiment, provision is made for the clamping ring 14 to have power terminals 16 for heating purposes. Alternatively, some other energization or heating can also be provided. In the exemplary embodiment, provision is made (not illustrated) for the clamping ring 14 to include or to be provided with one or more wires connected to the power terminals 16 in order to heat the clamping ring 14.

In the exemplary embodiment, provision is made for the clamping ring 14 in the setting state to have a temperature of 40° C. to 100° C. (e.g., 50° C. to 90° C., 50° C. to 80° C., 50° C. to 70° C., 60° C.+/−5° C.).

In the exemplary embodiment, provision is furthermore made for the clamping ring 14 in the operating state to have a temperature of 10° C. to 30° C. (e.g., 15° C. to 25° C., 20° C. to 25° C., 22° C.+/−2° C., ambient temperature).

In the exemplary embodiment, the clamping ring 14 is optionally embodied from high-grade steel. In the exemplary embodiment, the adjusting element 13 is optionally embodied from an iron-nickel compound, optionally Invar. What is achieved as a result is that, if the clamping ring 14 is heated, the output element 9 does not expand or does not expand to the same extent as the clamping ring 14.

In order that an expansion of the clamping ring 14 is made possible or not excessively hampered, in the exemplary embodiment, provision is made for the clamping ring 14 to be connected to the housing 15 via webs 17 and/or connection elements and/or joints.

In the exemplary embodiment, provision is made for the webs 17 and/or the connection elements and/or the joints to be flexible and/or compliant and/or yield in the radial direction in order to enable a radial thermal expansion of the clamping ring 14, but are embodied in stiff and/or immobile fashion in the axial direction Z (see FIG. 6) in order to take up forces acting in the axial direction Z of the output element 9 and to introduce them into the support structure 5 via the housing 15.

As can be gathered from the basic illustration in FIG. 7, the webs 17 illustrated therein do not run in the radial direction or are not aligned with the center point of the output element 9 or of the clamping ring 14, such that if heat causes the clamping ring 14 to expand in the radial direction, transverse forces act on the webs 17 and have the effect that the webs 17 yield or are flexibly compliant and an expansion of the clamping ring 14 caused by heat is therefore not prevented.

In the exemplary embodiment, the housing 15 can be produced from any suitable material, in particular a material which both enables a thermal expansion of the clamping ring 14 and ensures that the clamping ring 14 is connected to the housing 15, optionally via webs 17, such that the forces to be taken up from the optical element 2 can be reliably introduced into the support structure 5. In this case, it is also possible for the housing 15 to be embodied from high-grade steel or Invar.

In the exemplary embodiment, provision is made for the adjusting element 13 to be configured to carry out a stroke movement in order to raise or lower the output element 9 in the axial direction Z (see FIG. 6). The stroke movement of the output element 9 and thus also of the second actuator unit 8 is symbolized by the double-headed arrow in FIG. 6. In the exemplary embodiment, it is provided that the adjusting element can carry out only a stroke movement and no movements in other directions. The output element 9 and the second actuator unit 8 can thus only be raised or lowered by the adjusting element 13. This is sufficient, however, to perform the desired coarse setting within the first setting range.

In the exemplary embodiment, the adjusting element 13 can be embodied in any desired manner, in principle. However, for the realization of the disclosure, in particular also for application in projection exposure apparatuses 100, 200, 400, it has proved to be particularly suitable if the adjusting element 13 is embodied as a thermal actuator. Thermal actuators bring about a linear movement as a result of their being heated. In this case, a material having significant thermal expansion, for example wax, is heated in the thermal actuator. In the exemplary embodiment, therefore, provision is made for the adjusting element 13 to be heated for the purpose of adjusting the output element 9. Thermal actuators of this type are known, for example also from space travel, and so their basic functioning is not discussed in greater detail below.

In the exemplary embodiment, (optionally) provision is made for the adjusting element 13 or a movable piston of the adjusting element already to have moved to the output element 9 and a mechanical connection to have been established before the force-locking connection between the output element 9 and the clamping ring 14 is released. This is intended to prevent the optical element 2 from changing its position or dropping as a result of the release of the force-locking connection. Afterward, the position of the output element 9 can be correspondingly changed via corresponding heating or cooling of the adjusting element 13. After the output element 9 has been adjusted to the desired extent within the first setting range by the adjusting element 13, that is to say that a coarse setting has been performed, provision is made for re-establishing a force-locking connection between the clamping ring 14 and the output element 9, such that the forces introduced by the optical element 2 are introduced again via the output element 9 onto the clamping ring 14 and from there via the housing 15 into the support structure 5. As a result, the operating state is re-established, in which provision is also made for the adjusting element 13 no longer to be heated and thus for the mechanical connection between the adjusting element 13 and the output element 9 to be released again. In the exemplary embodiment, provision is made for the adjusting element to exert no force on the output element 9 in the operating state.

What is claimed is:

1. An actuator device, comprising:
   a first actuator unit securable to a support structure, the first actuator comprising:
      an output element;
      an adjusting element securable to the support structure; and
      a fixing element securable to the support structure; and
   a second actuator unit securable to an optical element, wherein:
      the second actuator unit is operatively connected to the output element so that a position of the second actuator unit is adjustable via an adjustment of the output element;
      in an operating state of the optical element, the fixing element is configured to secure the output element in a force-locking manner;
      in a setting state of the optical element, the fixing element is configured to release the force-locking connection to allow the adjusting element to adjust the output element.

2. The actuator device of claim 1, wherein the first actuator unit comprises a housing securable to the support structure, and at least one member selected from the group consisting of the fixing element and the adjusting element is secured in the housing.

3. The actuator device of claim 1, wherein the fixing element is configured to secure the output element in a force-locking manner via clamping.

4. The actuator device of claim 1, wherein, in the operating state, the fixing element is shrink-fit onto at least a part of the output element.

5. The actuator device of claim 1, wherein the fixing element comprises a clamping ring.

6. The actuator device of claim 5, wherein:
   the clamping ring has a receiving opening which circumferentially encompasses at least one part of the output element;
   in the operating state, the receiving opening has a first diameter to fix the output element in a force-locking manner;
   in the setting state, the receiving opening in the setting state has a second diameter so that the force-locking connection to the output element is released to allow an adjustment of the output element via the adjusting element; and
   the second diameter is larger than the first diameter.

7. The actuator device of claim 5, wherein the clamping ring is heated in the setting state.

8. The actuator device of claim 7, wherein the clamping ring comprises power terminals and/or is energizable for heating purposes.

9. The actuator device of claim 5, wherein:
   the first actuator unit comprises a housing securable to the support structure;
   at least one member selected from the group consisting of the fixing element and the adjusting element is secured in the housing; and the clamping ring is connected to the housing via at least one group of members selected from the group consisting of webs, connection elements and joints.

10. The actuator device of claim 9, wherein:
the at least one group of members are flexible and/or compliant and/or yield in the radial direction in order to allow a radial thermal expansion of the clamping ring; and
the at least one group of members are stiff and/or immobile in an axial direction to take up forces acting in the axial direction of the output element and to introduce the forces acting in the axial direction into the support structure via the housing.

11. The actuator device of claim 5, wherein, in the setting state, the clamping ring has a temperature of 40° C. to 100° C.

12. The actuator device of claim 5, wherein, in the operating state, the clamping ring has a temperature of 10° C. to 30° C.

13. The actuator device of claim 1, wherein the adjusting element is heatable to adjust the output element.

14. The actuator device of claim 13, wherein, in the operating state, the adjusting element is mechanically separated from the output element and/or exerts no force on the output element.

15. The actuator device of claim 13, wherein the adjusting element is configured to carry out a stroke movement to raise or lower the output element in the axial direction.

16. The actuator device of claim 1, wherein a setting range of the first actuator unit is three to twenty times a setting range of the second actuator unit.

17. The actuator device of claim 1, wherein s setting range of the first actuator unit is 700 to 1500 µm, and/or s setting range of the second actuator unit is 10 to 200 µm.

18. The actuator device of claim 1, wherein the optical element comprises an optical element of a projection exposure apparatus.

19. An apparatus, comprising:
an illumination system; and
an optical unit comprising an optical element and an actuator device,
wherein the actuator device comprises:
a first actuator unit securable to a support structure, the first actuator comprising:
an output element;
an adjusting element securable to the support structure; and
a fixing element securable to the support structure; and
a second actuator unit securable to the optical element,
wherein:
the second actuator unit is operatively connected to the output element so that a position of the second actuator unit is adjustable via an adjustment of the output element;

in an operating state of the optical element, the fixing element is configured to secure the output element in a force-locking manner;
in a setting state of the optical element, the fixing element is configured to release the force-locking connection to allow the adjusting element to adjust the output element; and
the apparatus is a semiconductor lithography projection exposure apparatus.

20. A method to aligning an optical element via an actuator device which comprises a first actuator unit and a second actuator unit, the first actuator unit secured to a support structure, the second actuator unit secured to an optical element, the second actuator unit operatively connected to an output element of the first actuator unit so a position of the second actuator unit is adjustable via an adjustment of the output element, the first actuator unit comprising a fixing element and an adjusting element, the fixing element secured to the support structure, the method comprising:
a) using the fixing element to secure the output element in a force-locking manner in an operating state of the optical element;
b) after a), releasing the force-locking connection in a setting state of the element to align the optical element within a first setting range;
c) after b), using the adjusting element to adjust the output element; and
d) after c) using the fixing element to close the force-locking connection.

21. The method of claim 20, further comprising:
using the first setting range for a coarse setting; and
using a setting range of the second actuator unit for a fine setting in the operating state of the element to align the optical element.

22. The method of claim 20, further comprising, during b), using the first actuator unit to measure the alignment the optical element and to effect the setting until a defined alignment of the optical element is attained.

23. The method of claim 20, further comprising heating the adjusting element to adjust the output element.

24. The method of claim 20, wherein the optical element is an optical element of a projection exposure apparatus, and the method further comprises:
e) effecting the alignment of the optical element in the setting state by a procedure in which the first actuator unit positions the second actuator unit and the fixing element releases the force-locking connection to the output element; and
f) after e), using the second actuator unit to effect the alignment of the optical element in the operating state.

* * * * *

UNITED STATES PATENT AND TRADEMARK OFFICE
CERTIFICATE OF CORRECTION

PATENT NO. : 11,320,749 B2
APPLICATION NO. : 17/220305
DATED : May 3, 2022
INVENTOR(S) : Boaz Pnini

It is certified that error appears in the above-identified patent and that said Letters Patent is hereby corrected as shown below:

In the Claims

Column 19, Line 32, Claim 17, delete "wherein s" and insert -- wherein a --;

Column 19, Line 33, Claim 17, delete "s setting" and insert -- a setting --.

Signed and Sealed this
Twenty-eighth Day of June, 2022

Katherine Kelly Vidal
*Director of the United States Patent and Trademark Office*